United States Patent [19]
Mochida

[11] Patent Number: 6,091,662
[45] Date of Patent: Jul. 18, 2000

[54] SEMICONDUCTOR SYNCHRONOUS PIPELINE MEMORY HAVING DATA AMPLIFIERS SELECTIVELY SUPPLIED WITH DATA SIGNALS

[75] Inventor: Yoshifumi Mochida, Tokyo, Japan

[73] Assignee: NEC Corporation, Tokyo, Japan

[21] Appl. No.: 09/093,339

[22] Filed: Jun. 9, 1998

[30] Foreign Application Priority Data

Jun. 12, 1997 [JP] Japan ................................. 9-155091

[51] Int. Cl.[7] .................................................. G11C 8/00
[52] U.S. Cl. ............................ 365/233; 365/205; 365/63
[58] Field of Search ................................. 365/233, 205, 365/51, 63, 207

[56] References Cited

U.S. PATENT DOCUMENTS

| | | | |
|---|---|---|---|
| 5,550,784 | 8/1996 | Takai | 365/233 |
| 5,729,500 | 3/1998 | Shinozaki | 365/233 X |
| 5,859,793 | 1/1999 | Satani et al. | 365/63 |
| 5,895,482 | 4/1999 | Toda | 365/233 X |

FOREIGN PATENT DOCUMENTS

| | | |
|---|---|---|
| 4-221495 | 8/1992 | Japan . |
| 6-76566 | 3/1994 | Japan . |
| 7-65578 | 3/1995 | Japan . |
| 7-169275 | 7/1995 | Japan . |

*Primary Examiner*—Huan Hoang
*Attorney, Agent, or Firm*—McGinn & Gibb, P.C.

[57] ABSTRACT

A semiconductor synchronous pipeline dynamic random access memory device has a first read data amplifier and plural second read data amplifiers connected through a read/write data bus to the first read data amplifier, and read-out data bits are alternately supplied to the plural second read data amplifiers so that the read-out data bit is never destroyed by the next read-out data bit.

5 Claims, 6 Drawing Sheets

SEMICONDUCTOR SYNCHRONOUS PIPELINE MEMORY HAVING DATA AMPLIFIERS SELECTIVELY SUPPLIED WITH DATA SIGNALS

FIELD OF THE INVENTION

This invention relates to a semiconductor synchronous pipeline memory and, more particularly, to a semiconductor synchronous pipeline memory having plural data amplifiers selectively supplied with read-out data signals.

DESCRIPTION OF THE RELATED ART

Figure 1:
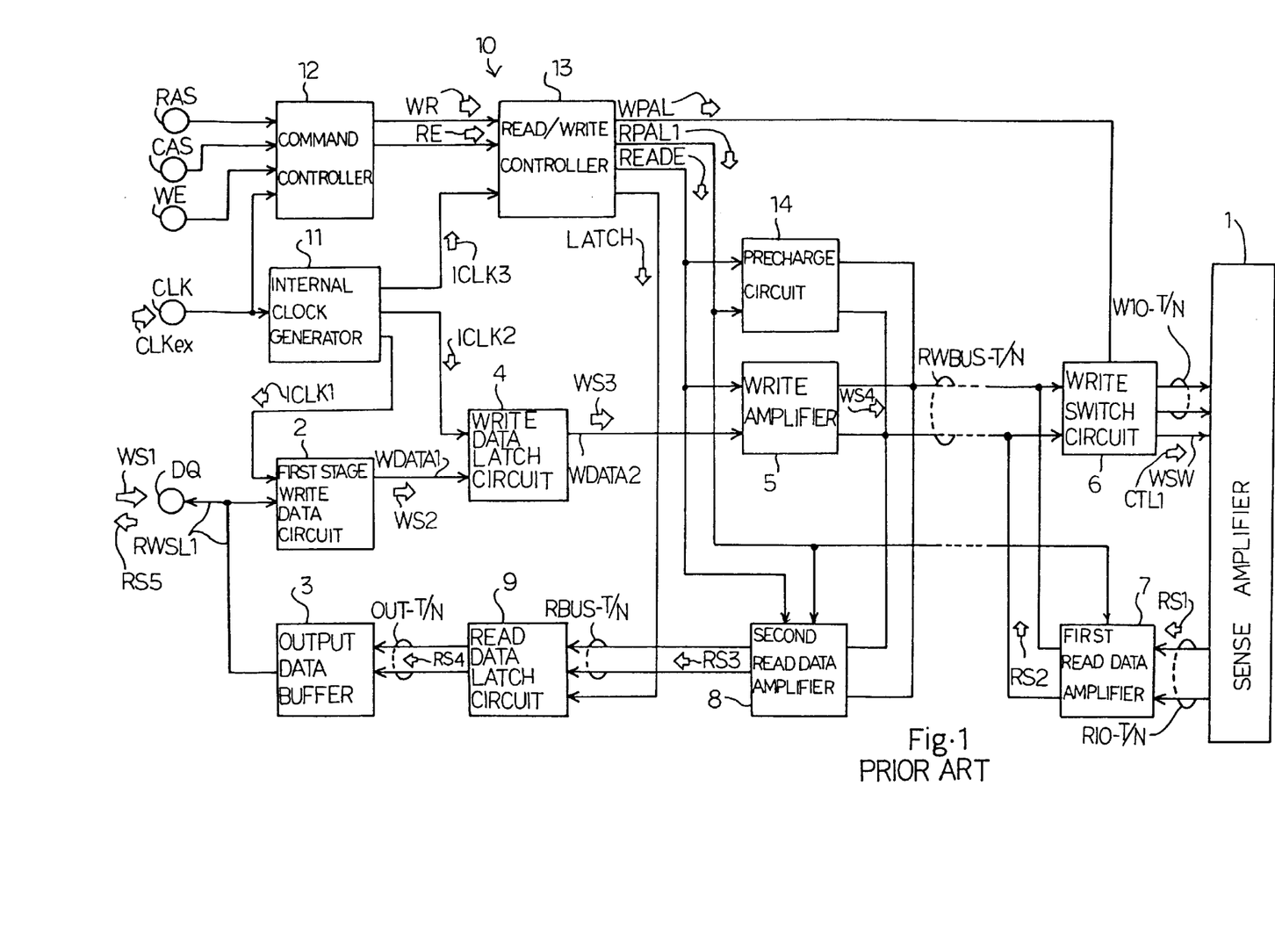
FIG. 1 is a block diagram showing the prior art pipeline data propagation circuits incorporated in the semiconductor dynamic random access memory device.

A computer system is getting faster and faster, and manufacturers find big demand for a high-speed semiconductor dynamic random access memory device. One of the approaches for the speed-up is the pipeline architecture, and a typical example of the semiconductor pipeline dynamic random access memory device is disclosed in Japanese Patent Publication of Unexamined Application No. 6-76566. FIG. 1 illustrates a sequence of data propagation circuits incorporated in the prior art semiconductor pipeline dynamic random access memory device.

The sequence of data propagation circuits is provided between a data pin DQ and a sense amplifier 1. A first-stage write data circuit 2 and an output data buffer 3 are connected through a read/write signal line RWSL1 to the data pin DQ.

A write data latch circuit 5 and a write switch circuit 6 are arranged in series between the first-stage write data circuit 2 and the sense amplifier 1. A write data signal line WDATA1 and a write data signal line WDATA2 are connected between the first-stage write data circuit 2 and the write data latch circuit 4 and between the write data latch circuit 4 and the write amplifier 5, and a read-write data bus RWBUS-T/N and a write data bus WIO-T/N are connected between the write amplifier 5 and the write switch circuit 6 and between the write switch circuit 6 and the sense amplifier 1, respectively. A control signal line WSW is further connected between the write switching circuit 6 and the sense amplifier 1. Though not shown in FIG. 1, a memory cell array is connected to the sense amplifier 1.

A first read data amplifier 7, a second read data amplifier 8 and a read data latch circuit 9 are arranged in series between the sense amplifier 1 and the output data buffer 3. A read-data bus RIO-TIN is connected between the sense amplifier 1 and the first read data amplifier 7, and the read/write data bus RWBUS-T/N is further connected between the first read data amplifier 7 and the second read data amplifier 8. A read data bus RBUS-T/N is connected between the second read data amplifier 8 and the read data latch circuit 9, and another read data bus OUT-TIN is connected between the read data latch circuit 9 and the output data buffer 3.

The sequence of data propagation circuits 2 to 9 is associated with a pipeline controlling system 10, and the pipeline controlling system 10 comprises an internal clock generator 11, a command controller 12, a read/write controller 13 and a precharge circuit 14.

The internal clock generator 11 is connected to a clock pin CLK, and an external clock signal CLKex is supplied to the internal clock generator 11 and the command controller 12, and the internal clock generator 11 produces an internal clock signal CLKin in synchronism with the external clock signal CLKex. The internal clock generator 11 distributes the internal clock signal ICLK1, ICLK2 and ICLK3 to the first-stage write data circuit 2, the write data latch circuit 4 and the read/ write controller 13.

The command controller 12 is connected to control signal pins RAS, CAS and WE, and a row address strobe signal of active low level, a column address strobe signal of the active low level and a write enable signal of the active low level are supplied from the control signal pins RAS, CAS and WE to the command controller 12. The external clock signal CLKex gives appropriate timings to the command controller 12, and the row address strobe signal, the column address strobe signal and the write enable signal are latched by the command controller 12. The command controller 12 interprets commands represented by the row address strobe signal, the column address strobe signal and the write enable signal, and produces a write initiation signal WR and a read initiation signal RE. The write initiation signal WR and the read initiation signal RE are supplied from the command controller 12 to the read/write controller 13.

The read/write controller 13 is responsive to the write initiation signal WR and the read initiation signal RE for generating control signals. The internal clock signal ICLK3 gives appropriate timings to the read/write controller 13. The control signals are called as a write pulse signal WPAL, a read pulse signal RPAL1, a read enable signal READE and a latch control signal LATCH, respectively. The write pulse signal WPAL is supplied to the write switch circuit 6, and the read pulse signal RPAL1 is supplied to the precharge circuit 14, the second read data amplifier 8 and the first read data amplifier 7. The read enable signal READE is supplied to the precharge circuit 14, the write amplifier 5 and the second read data amplifier 8, and the latch control signal LATCH is supplied to the read data latch circuit 9. The read pulse signal RPAL1 alters the potential level in synchronism with the internal clock signal ICLK3.

The first-stage write data circuit 2 is implemented by D flip-flop circuits, and is responsive to an external write data signal WS1 for producing an internal write data sional WS2 at an appropriate timing given by the internal clock signal ICLK1.

The write data latch circuit 4 is also implemented by the D flip-flop circuits, and is responsive to the internal clock signal ICLK2 so as to temporarily store the write-in data represented by the internal write data signal WS2. The stored write-in data is supplied to the write data signal line WDATA2 as an internal write data signal WS3.

When the read enable signal READE is in the low level, the write amplifier 5 becomes responsive to the internal write data signal WS3, and drives the read/write data bus RWBUS-T/N so as to produce an internal write data signal and the complementary signal thereof WS4 representative of the write-in data. The write amplifier 5 puts the internal write data signal and the complementary signal WS4 on the read/write data bus RWBUS-T/N. On the other hand, when the read enable signal READE is in the high level, the write amplifier 5 enters into the high-impedance state, and does not affect the read/ write data bus RWBUS-T/N.

The write pulse signal WPAL activates the write switch circuit 6. The write switch circuit 6 supplies a control signal CTL1 to the sense amplifier 1, and transfers the internal write data signal/complementary signal WS4 from the read-write data bus RWBUS-T/N to the write data bus WIO-T/N.

The sense amplifier 1 not only increases the magnitude of potential difference but also steers the read/write data signal between a selected bit line pair (not shown) and the read/ write data buses WIO-T/N and RIO-T/N. Namely, the sense amplifier 1 is responsive to the control signal CTL1 so as to selectively connect the bit line pairs to the read/write data buses WIO-T/N and RIO-T/N. When the control signal CTL1 is in the high level, the sense amplifier 1 connects the write data bus WIO-T/N to a selected bit line pair assigned the column address specified by a column address signal (not shown), and the internal write data signal/ complementary signal WS4 is transferred through the sense amplifier 1 to the selected bit line pair. On the other hand, when the control signal CTL1 is in the low level, the sense amplifier 1 connects the selected bit line pair to the read data bus RIO-T/N, and transfers a potential difference from the selected bit line pair to the read data bus RIO-T/N. The potential difference on the read data bus RIO-T/N forms a read data signal RS1 and the complementary signal thereof.

The first read data amplifier 7 is activated by the read pulse signal RPAL1, and increases the magnitude of potential difference between the read data signal/ the complementary signal RS1 on the read data bus RIO-T/N. The first read data amplifier 7 puts the increased potential difference on the read/write data bus RWBUS-T/N as a read data signal and the complementary signal thereof RS2. The read data signal/ complementary signal RS2 is altered between high level and low level, which are between the thresholds of the write switch circuit 6. The write switch circuit 6 decides the high level and the low level of the read data signal/ complementary signal RS2 to be the high level.

The precharge circuit 14 is enabled with the read enable signal READE, and charges the read/write data bus RWBUS-T/N to the high level in the inactive period of the first data amplifier 7 during the data read-out operation. The second read data amplifier 8 is also enabled with the read enable signal READE, and is activated by a delay signal of the read pulse signal RPAL1. The second read data amplifier 8 latches the read data signal/ complementary signal RS2 on the read/write data bus RWBUS-T/N, and increases the potential difference between the read data signal RS2 and the complementary signal. The second read data amplifier 8 puts the increased potential difference on the read data bus RBUS-T/N as a read data signal/complementary signal RS3.

The read data latch circuit 9 is implemented by the D flip flop circuits, and is responsive to the latch control signal LATCH so as to store the read data signal/ complementary signal RS3. The read data latch circuit 9 puts the potential difference on the read data bus OUT-T/N as a read data signal/ complementary signal RS4.

The output data buffer 3 produces a read-out data signal RS5 from the read data signal/complementary signal RS4, and supplies it to the data pin DQ.

Figure 2:
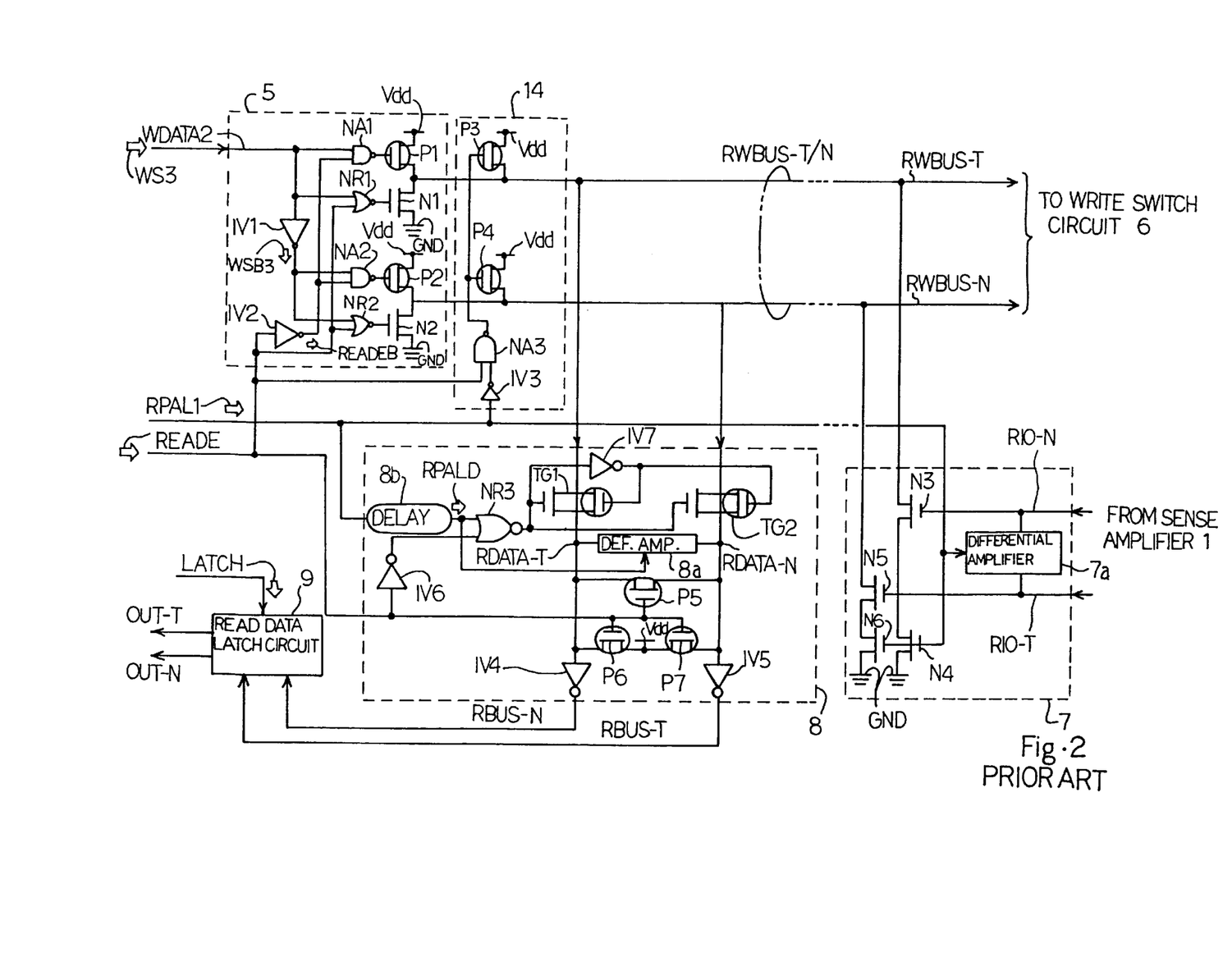
FIG. 2 is a circuit diagram showing the circuit configuration of the prior art pipeline data propagation circuits.

FIG. 2 illustrates the circuit configuration of the prior art pipeline data propagation circuits. The write amplifier 5, the precharge circuit 14, the first read data amplifier 7 and the second read data amplifier 8 are detailed hereinbelow.

The write amplifier 5 includes two inverters IV1/IV2, two NAND gates NA1/ NA2, two NOR gates NR1/ NR2 and two output inverters P1/N1 and P2/N2. Each of the output inverters is implemented by a series combination of a p-channel enhancement type field effect transistor P1/P2 and an n-channel enhancement type field effect transistor N1/N2, and is connected between a positive power supply line Vdd and a ground line GND. The write data signal WS3 and the read enable signal READE are respectively supplied to the inverters IV1/IV2, and the inverters produces a complementary signal WSB3 and a complementary signal READEB from the write data signal WS3 and the read enable signal READE, respectively. The write data signal WS3, the complementary signal WSB3, the read enable signal READE and the complementary signal READEB are selectively supplied to the NAND gates NA1/ NA2 and the NOR gates NR1/ NR2.

The read enable signal READE is supplied to the NOR gates NR1/ NR2, and the complementary signal READEB is supplied to the NAND gates NA1/ NA2. For this reason, when the read enable signal READE is changed to the low level, the NOR gates NR1/ NR2 and the NAND gates NA1/ NA2 are concurrently enabled with the read enable signal READE and the complementary signal READEB.

The write data signal WS3 are supplied to the NAND gate NA1 and the NOR gate NR1, and the complementary signal WSB3 is supplied to the other NAND gate NA2 and the other NOR gate NR2. The NAND gates NA1/ NA2 supply the output signals to the gate electrodes of the p-channel enhancement type field effect transistors P1/ P2, and the NOR gates NR1/ NR2 supply the output signals to the gate electrodes of the n-channel enhancement type field effect transistors N1/ N2. For this reason, the p-channel enhancement type field effect transistors P1/ P2 are complementarily changed between on-state and off-stage, and the n-channel enhancement type field effect transistors N1/ N2 are also complementarily switched between the on-state and the off-state. As a result, the internal write data signal/ complementary signal WS4 are produced on the read/write data bus lines RWBUS-T/ RWBUS-N.

The precharge circuit 14 includes p-channel enhancement type field effect transistors P3/ P4 connected between the power supply line Vdd and the read/write data bus lines RWBUS-T/ RWBUS-N, a NAND gate NA3 and an inverter IV3. The inverter IV3 has an input node, to which the read pulse RPAL1 is supplied. The output node of the inverter IV3 is connected to one of the input node of the NAND gate NA3, and the read enable signal READE is supplied to the other input node of the NAND gate NA3. For this reason, the NAND gate NA3 is enabled with the read enable signal READE of the high level, and supplies an output signal of the low level to the gate electrodes of the p-channel enhancement type field effect transistors P3/ P4 in synchronism with the complementary signal of the read pulse signal RPAL1. With the output signal of the low level, the p-channel enhancement type field effect transistors P3/ P4 turn on, and charge the read/write data bus lines RWBUS-T/ RWBUS-N to the positive power level.

The first read data amplifier 7 comprises two series combinations of n-channel enhancement type field effect transistors N3/ N4 and N5/ N6 connected between the read/write data bus lines RWBUS-T/ RWBUS-N and the ground line GND and a differential amplifier 7a. The differential amplifier 7a is activated with the read pulse signal RPAL1, and increases the potential difference on the read data bus RIO-T/N. The read data bus lines RIO-T/N are connected to the data electrodes of the n-channel enhancement type field effect transistors N5/ N3, and the read pulse signal RPAL1 is supplied to the gate electrodes of the n-channel enhancement type field effect transistors N4/ N6. When the read pulse signal RPAL1 is changed to the high level, the n-channel enhancement type field effect transistors N4/ N6 turn on, and the read data bus lines RIO-N/ RIO-T cause the other n-channel enhancement type field effect transistors N3/ N5 to selectively turn on. Then, one of the read/write data bus lines RWBUS-T/ RWBUS-N are selectively discharged, and the potential difference on the read data bus RIO-T/ RIO-N is transferred to the read/write data bus RWBUS-T/ RWBUS-N.

The second read data amplifier 8 includes a differential amplifier 8a connected between the read/write data bus lines RWBUS-T/ RWBUS-N, two transfer gates TG1/ TG2 connected between the read/ write bus RWBUS-T/ RWBUS-N and the data nodes RDATA-T/ RDATA-N of the differential amplifier 8a, a p-channel enhancement type field effect transistor P5 connected between the data nodes RDATA-T/ RDATA-N, two p-channel enhancement type field effect transistors P6/ P7 connected between the positive power supply line Vdd and the data nodes RDATA-T/ RDATA-N, output inverters IV4/ IV5 connected between the differential amplifier 8a and the read data bus lines RBUS-T/ RBUS-N, a delay circuit 8b for producing a delay signal RPALD from the read pulse signal RPAL1, inverters IV6/ IV7 and a NOR gate NR3.

The read enable signal READE causes the p-channel enhancement type field effect transistor P5 and the p-channel enhancement type field effect transistors P6/P7 to concurrently turn on and off. When the read enable signal REAE is in the low level, the p-channel enhancement type field effect transistors P5 to P7 turn on, and charge the data nodes RDATA-T/ RDATA-N to the positive power voltage level. On the other hand, when the read enable signal READE is changed to the high level, the p-channel enhancement type field effect transistors P5 to P7 turn off, and the data node RDATA-T/N are isolated from the power supply line Vdd.

The inverter IV6 supplies the complementary read enable signal to the NOR gate NR3, and the NOR gate NR3 is enabled with the complementary read enable signal READE of the low level. The delay circuit 8b supplies the delay signal RPALD to the NOR gate NR3 and the differential amplifier 8a, and the NOR gate NR3 and the inverter IV7 change the transfer gates TG1/ TG2 between the on-state and the off-state. The transfer gates TG1/ TG2 are turned on, and the read/write data bus lines RWBUS-T/ RWBUS-N are connected to the data nodes RDATA-T/ RDATA-N. The differential amplifier 8a is activated with the delay signal RPALD, and increases the magnitude of the potential difference between the data nodes RDATA-T/ RDATA-N. The output inverters IV4/ IV5 transfer the potential difference at the data nodes RDATA-T/ RDATA-N to the read data bus lines RBUS-N/ RBUS-T.

Figure 3:
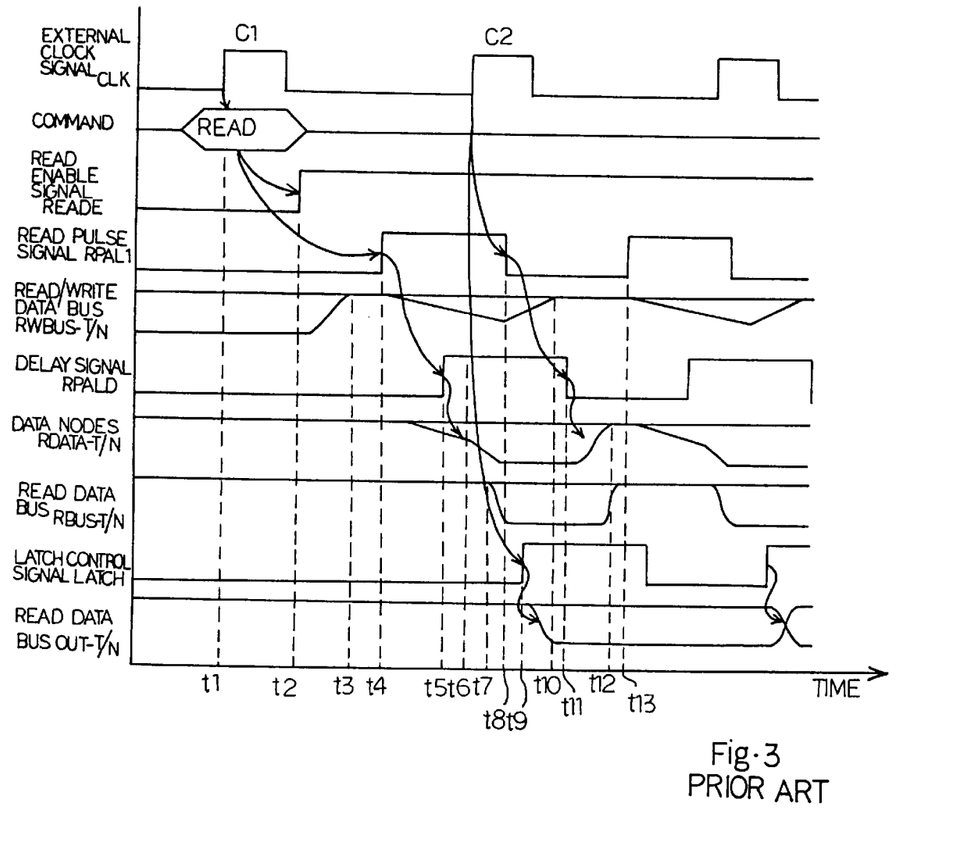
FIG. 3 is a timing chart showing the behavior of the prior art pipeline data propagation circuits.

FIG. 3 illustrates the behavior of the pipe line data propagation path. A command representative of the data read-out is supplied through the control pins RAS/ CAS/ WE to the command controller 12, and the command is latched by the command controller 12 at time t1. The command controller 12 interprets the command "READ", and changes the read enable signal RE to the active level. The internal clock generator 11 changes the internal clock signal ICLK3 to the high level, and the read/write controller 13 changes the read enable signal READE to the active level at time t2.

Then, the read enable signal READE of the high level disables the NOR gates NR1/NR2 and the NAND gates NA1/NA2, and the NOR gates NR1/ NR2 and the NAND gates NA1/ NA2 supply the low level and the high level to the n-channel enhancement type field effect transistors N1/N2 and the p-channel enhancement type field effect transistors P1/ P2. The n-channel enhancement type field effect transistors N1/ N2 and the p-channel enhancement type field effect transistors P1/ P2 turn off, and electrically isolate the read/ write data bus RWBUS-T/ RWBUS-N from the power sources Vdd/ GND.

The NAND gate NA3 is enabled with the read enable signal READE of the high level, and the read pulse signal RPAL1 of the low level causes the inverter IV3 to supply the high level to the NAND gate NA3. Then, the NAND gate NA3 supplies the low level to the gate electrodes of the p-channel enhancement type field effect transistors P3/ P4, and the p-channel enhancement type field effect transistors P3/ P4 starts to charge the read/write data bus lines RWBUS-T/N. The read/write data bus lines RWBUS-T/N reach the positive power voltage level Vdd at time t3.

The read enable signal READE of the high level causes the p-channel enhancement type field effect transistors P5 to P7 to turn off, and the p-channel enhancement type field effect transistors P5-P7 electrically isolate the data nodes RDATA-T/N from the positive power voltage line Vdd.

The delay signal RPALD is in the low level, and enables the NOR gate NR3. The read enable signal READE of the high level is inverted by the inverter IV6, and the inverter IV6 supplies the low level to the NOR gate NR3. The NOR gate NR3 supplies the high level to the n-channel enhancement type field effect transistors of the transfer gates TG1/ TG2, and the inverter IV7 supplies the low level to the p-channel enhancement type field effect transistors of the transfer gates TG1/TG2. As a result, the transfer gates TG1/TG2 turns on, and the read/write data bus RWBUS-T/N is electrically connected to the data nodes RDATA-T/N of the differential amplifier 8a.

The read/ write controller 13 raises the read-pulse signal RPAL1 at time t4, and the read-pulse signal RPAL1 is supplied to the delay circuit 8b, the inverter IV3 and the n-channel enhancement type field effect transistors N4/ N6. The inverter IV3 causes the NAND gate NA3 to change the gate electrodes of the p-channel enhancement type field effect transistors P3/ P4 to the high level, and the p-channel enhancement type field effect transistors P3/ P4 turn off so as to isolate the read/write data bus lines RWBUS-T/N from the power supply line Vdd. On the other hand, the n-channel enhancement type field effect transistors N4/ N6 turn on, and connect the source nodes of the n-channel enhancement type field effect transistors N3/ N5 to the ground line GND. The differential amplifier 7a has already completed the differential amplification on the read data bus RIO-T/N, and the potential difference on the read data bus RIO-T/N causes the n-channel enhancement type field effect transistors N3/N5 to selectively turn on and off. For this reason, one of the read/write data bus lines RWBUS-T/N goes down, and the potential difference on the read data bus RIO-T/N is transferred to the read/write data bus RWBUS-T/N. The transfer gates TG1/TG2 have been already connected to the data nodes RDATA-T/N, and the potential difference is further transferred from the read/write data bus RWBUS-T/N to the data nodes RDATA-T/N. The potential difference between the data nodes RDATA-T/N is developed at low-speed, because the differential amplifier 8a has not been activated, yet.

The delay circuit 8b introduces time delay into the propagation of the read pulse signal RPAL1, and changes the delay signal RPALD to the high level at time tS, and the NOR gate NR3 changes the output node to the low level. The transfer gates TG1/ TG2 turn off, and the data nodes RDATA-T/N are cut off from the read/write data bus RWBUS-T/N. The delay signal RPALD activates the differential amplifier 8a, and the potential difference between the data nodes RDATA-TIN is rapidly increased.

The potential difference between the data nodes RDATA-T/N exceeds the threshold of the output inverters I1V4/ 1V5 at time t7, and the potential difference is transferred to the read data bus RBUS-T/N.

The external clock signal CLKex rises to the high level at time t6, again, and the read/write controller 13 changes the read pulse signal RPAL1 to the low level at time t8 and the latch control signal LATCH to the high level at time t9.

The latch signal LATCH is supplied to the read data latch circuit 9, and causes the read latch circuit 9 to store the potential difference on the read data bus RBUS-T/N. The read latch circuit 9 puts the potential difference on the read data bus OUT-T/N, and the output data buffer 3 produces the read data signal RS5 from the potential difference on the read data bus OUT-T/N. Thus, the potential difference on the read data bus RIO-T/N is sequentially transferred to the output data buffer 3, and the read-out data is output from the prior art pipeline dynamic random access memory device.

The read pulse signal RPAL1 of the low level is supplied to the delay circuit 8b, the inverter IV3, the n-channel enhancement type field effect transistors N4/ N6 and the differential amplifier 7a. The n-channel enhancement type field effect transistors N4/N6 turn off, and the read/write data bus RWBUS-T/N is electrically isolated from the ground line GND. The differential amplifier 7a stops the differential amplification.

The inverter IV3 changes the input node of the NAND gate NA3 to the high level, and the NAND gate NA3 changes the gate electrodes of the p-channel enhancement type field effect transistors P3/P4 to the low level. The p-channel enhancement type field effect transistors P3/P4 turn on, and charge the read/write data bus RWBUS-T/N. For this reason, the read/write data bus RWBUS-T/N is recovered to the positive high voltage level at time t10. The delay circuit 8b changes the delay signal RPALD to the low level at time t11. The differential amplifier 8a terminates the differential amplification, and the transfer gates TG1/TG2 turn on. The precharge circuit 14 further charges the data nodes RDATA-T/N, and the data nodes RDATA-T/N are recovered to the positive power voltage level Vdd at time t12.

The read pulse signal PRAL1 rises to the high level at time t13, and the prior art semiconductor pipeline dynamic random access memory device repeats the above described pipeline read-out sequence.

The prior art semiconductor pipeline dynamic random access memory device is expected to achieve the following tasks between the two clock pulses C1 and C2. The first task is that the first read data amplifier 7 drives the n-channel enhancement type field effect transistors N3/ N5 so as to transfer the potential difference on the read data bus RIO-T/N through the read/write data bus RWBUS-T/N to the data nodes RDATA-T/N of the second read data amplifier 8. The second task is that the second read data amplifier 8 increases the magnitude of the potential difference between the data nodes RDATA-T/N so as to transfer it through the read data bus RBUS-T/N to the read data latch circuit 9. The third task is that the precharge circuit 14 charges the data nodes RDATA-T/N as well as the read/write data bus RWBUS-T/N.

The prior art semiconductor pipeline dynamic random access memory device encounters the following problems. The first problem is undesirable data destruction. If the first task overlaps with the second task, the second read data amplifier 8 destroys the read-out data transferred to the read/write data bus RWBUS-T/N. It is impossible to concurrently carry out the other combination of tasks.

The second problem is that the cycle time is hardly shortened. The cycle time is equal to the three time periods respectively consumed for the first, second and third tasks, and the resistance on the bus and the parasitic capacitance coupled to the bus determine the time period for the signal propagation or the essential part of each of the three time periods. As described hereinbefore, it is impossible to concurrently carry out the tasks, and the total time period or the cycle time is hardly shortened.

SUMMARY OF THE INVENTION

It is therefore an important object of the present invention to provide a semiconductor synchronous pipeline memory, which is free from the data destruction and easy for accelerating the pipeline operation.

To accomplish the object, the present invention proposes to selectively supply pieces of read-out data to a plurality of second data amplifiers connected in parallel to a read/write data bus.

In accordance with one aspect of the present invention, there is provided a semiconductor synchronous pipeline memory device comprising a data storage for storing pieces of data and a data propagation system for propagating pieces of data between a data port and the data storage, and the data propagation system includes a first data amplifier receiving data signals respectively representative of the pieces of data from the data storage at intervals and increasing the magnitude of each of the data signals, a plurality of second data amplifiers arranged in parallel with respect to the first data amplifier, receiving the data signals from the first data amplifier at intervals and increasing the magnitude of each of the data signals, a first signal propagation path connected between the first data amplifier and the plurality of second data amplifiers for propagating the data signals, a data canceling circuit connected to the first signal propagation path so as to cancel each of the data signals after the aforesaid each of the data signals reaches one of the plurality of second data amplifiers, a data output circuit receiving the data signals from the plurality of second data amplifiers for successively outputting the data signals, a selector connected between the plurality of second data amplifiers and the data output circuit, a distributor connected to the plurality of second data amplifiers and distributing the data signals to the plurality of second data amplifiers in synchronism with a clock signal and a timing controller connected to the first data amplifier, the plurality of second data amplifiers, the data canceling circuit and the distributor for transferring the data signals through the first data amplifier to the data output circuit.

BRIEF DESCRRIPTION OF THE DRAWINGS

The features and advantages of the semiconductor synchronous memory device will be more clearly understood from the following description taken in conjunction with the accompanying drawings in which.

DESCRIPTION OF THE PREFERRED EMBODIMENTS

First Embodiment

Figure 4:
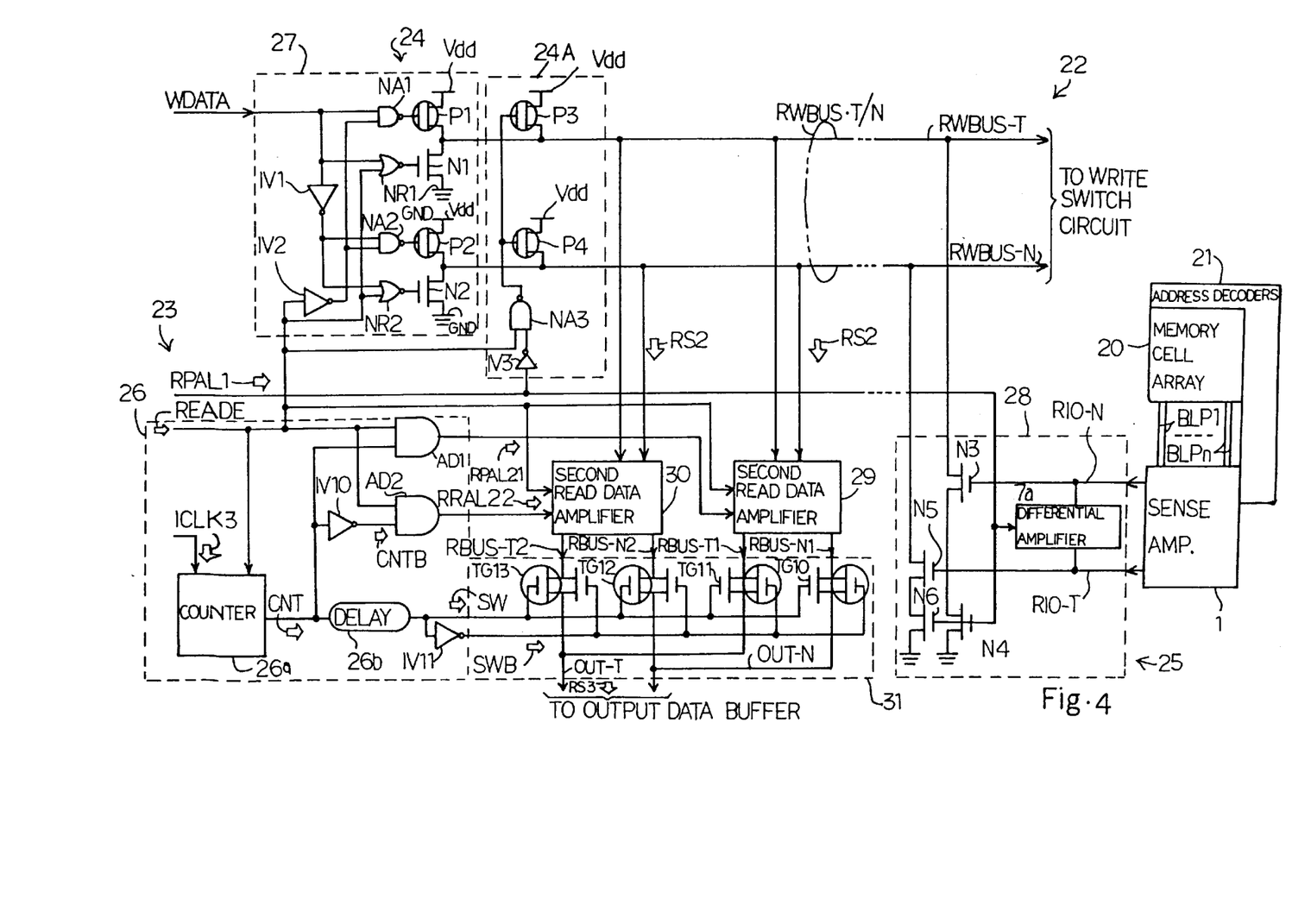
FIG. 4 is a circuit diagram showing essential circuits of a semiconductor synchronous pipeline memory device according to the present invention.

Referring to FIG. 4 of the drawings, a semiconductor pipeline synchronous dynamic random access memory device largely comprises a memory cell array 20, an addressing system 21 and a pipeline data propagation system 22. The memory cell array 20 is connected through plural bit line pairs BLP1-BLPn to the sense amplifier 1. The memory cell array 20 and the addressing system 21 are well known to a person skilled in the art, and no further description is incorporated hereinbelow.

The pipeline data propagation system 22 largely comprises a pipeline controller 23, a data write-in path 24 and a data read-out path 25, and a precharge circuit 24A is shared between the data write-in path 24 and the data read-out path 25. The precharge circuit 24A is similar to the precharge circuit 14 of the prior art semiconductor pipeline dynamic random access memory device, and circuit components are labeled with the same references designating corresponding circuit components of the precharge circuit 14 without detailed description. The precharging circuit 24A serves as a data canceling circuit.

The pipeline controller 23 includes an internal clock generator, a command controller, a read/write controller and a distributor 26. The internal clock generator, the command controller and the read/write controller are similar to those 11/12/13 of the prior art semiconductor pipeline dynamic random access memory device, and are not described. In this instance, the internal clock generator, the command controller and the read/write controller as a whole constitute a timing controller, and the distributor 26 is described in detail hereinlater.

The data write-in path 24 includes a first-stage write data circuit, a write data latch circuit, a write amplifier 27 and a write switch circuit. The first stage write data circuit, the write data latch circuit and the write switch circuit are similar to those 2/4/6 of the prior art semiconductor pipeline dynamic random access memory device, and are not described hereinbelow. Only the write amplifier 27 is shown in FIG. 4. However, the circuit configuration is similar to that of the write amplifier 5, and for this reason, the circuit components are labeled with the same references designating corresponding circuit components of the prior art write amplifier 5. The first-stage write data circuit is connected to the data pin DQ (see FIG. 1), and a write-in data signal is supplied from the data pin DQ to the first-stage write data circuit.

The data read-out path 25 includes a first read data amplifier 28, second read data amplifiers 29/30, a selector 31 and a output data buffer. The read data latch circuit 9 is deleted from the data read-out path 25, and two read data amplifiers 29/30 are connected in parallel between the read/write data bus RWBUS-T/N and the selector 31. The output data buffer is connected to the data pin DQ, and supplies a read-out data signal to the data pin DQ. The first read data amplifier 28 and the output data buffer is similar to those 7/3 of the prior art semiconductor pipeline dynamic random access memory device. The circuit components of the first read data amplifier 7 are labeled with the same references designating corresponding circuit components of the first read data amplifier 7 without detailed description.

The distributor 26 includes a counter 26a, an inverter IV10, two AND gates AD1/AD2, a delay circuit 26b and an inverter IVI1. The counter 26a is enabled with the read enable signal READE so as to count the internal clock signal ICLK3. The counter 26a increments the count value, and supplies a single-bit count signal CNT representative of the value of the least significant bit to the AND gate AD1, the inverter IV10 and the delay circuit 26b. The inverter IV10 inverts the count signal CNT, and supplies the complementary count signal CNTB to the AND gate AD2. The AND gates AD1/AD2 are also enabled with the read enable signal READE so as to complementarily change a control signal RPAL21 and the complementary control signal RPAL22 between the high level and the low level. The control signal RPAL21 and the complementary control signal RPAL22 are supplied to the second read data amplifiers 29/30, respectively.

The delay circuit 26b introduces time delay into the propagation of the count signal CNT, and produces a switching control signal SW from the count signal CNT. The inverter IV11 inverts the switching control signal SW, and produces the complementary switching control signal SWB. The switching control signal SW and the complementary switching control signal SWB are supplied to the selector 31.

The second read data amplifiers 29/30 are alternately activated with the control signal RPAL21 and the complementary control signal RPAL22, and increase the magnitude of the read data signal RS2. The second read data amplifiers 29/30 alternately output the read data signal RS3 onto two read data buses RBUS-T1/N1 and RBUS-T2/N2.

Figure 5:
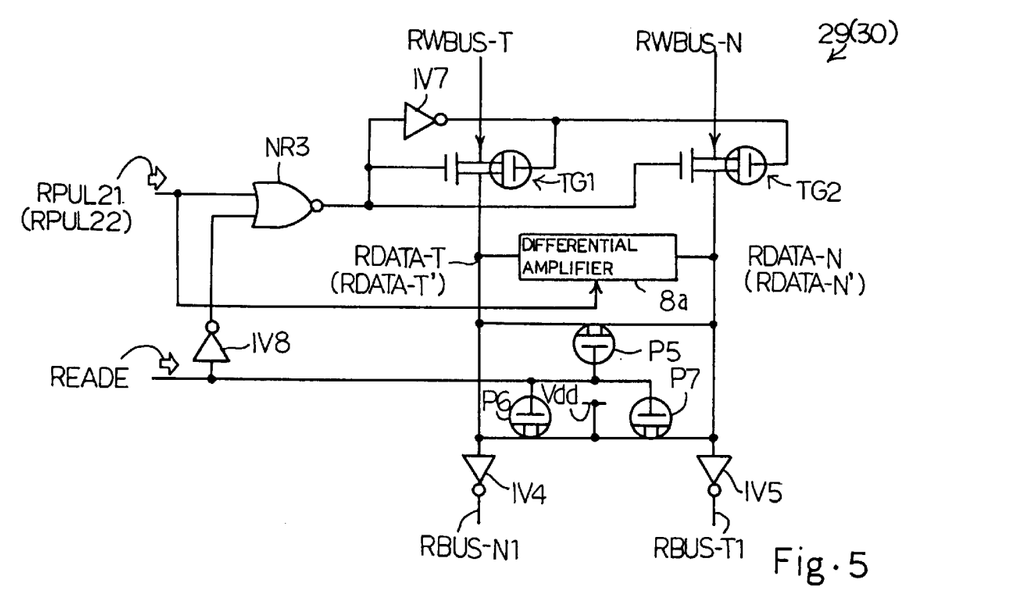
FIG. 5 is a circuit diagram showing the configuration of a second read data amplifier incorporated in the semiconductor synchronous pipeline memory device.

The second read data amplifiers 29/30 are similar in circuit configuration to one another, and FIG. 5 illustrates the circuit configuration of each second read data amplifier 29/30. The second read data amplifier 29/30 is similar in circuit configuration to the prior art second read data amplifier 8 except for the delay circuit 8b. Namely, the delay circuit 8b is deleted from the second read data amplifier 29/30. The other circuit components are labeled with the same references designating corresponding circuit components of the prior art second read data amplifier 8, and the NOR gate NR3 is supplied with the control signal RPUL21 or the complementary control signal RPUL22 instead of the read pulse signal RPAL1.

Turning back to FIG. 4 of the drawings, the selector 31 includes a pair of transfer gates TG10/TG11 connected between the read data bus RBUS-T1/N1 and the read data bus OUT-T/N and another pair of transfer gates TG12/TG13 connected between the read data bus RBUS-T2/N2 and the read data bus OUT-T/N. The switching control signal SW and the complementary signal SWB are supplied to the two pairs of transfer gates TG10/TG11 and RG12/TG13 in such a manner that the pairs of transfer gates TG10/TG11 and TG12/TG13 complementarily turn on and off. Thus, the selector 31 alternately connects the second read data amplifiers 29/30 to the read data bus OUT-T/N, and the read data bus OUT-T/N transfers the read data signal RS3 through the read data bus OUT-T/N to the output data buffer.

Figure 6:
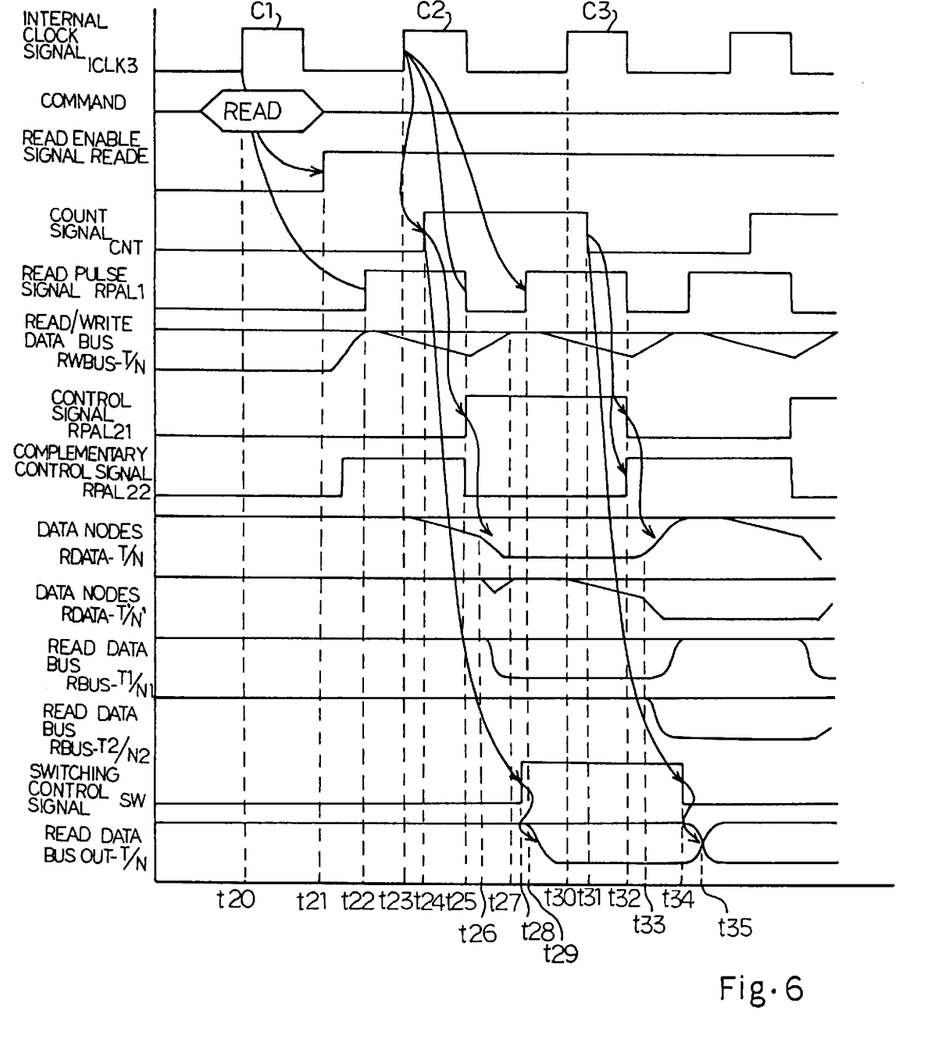
FIG. 6 is a timing chart showing the waveforms of essential signals produced in the semiconductor synchronous pipeline memory device during a read-out operation.

Description is hereinbelow made on a pipeline read-out operation with reference to FIG. 6. Circuits and circuit components not shown in FIGS. 4 and 5 are designated by the references assigned to the corresponding circuits and the corresponding circuit components shown in FIGS. 1 and 2.

A command "READ" is indicative of a pipeline read-out operation, and is supplied to the semiconductor synchronous pipeline dynamic random access memory device. The pipeline data propagation system 22 starts the pipeline read-out operation at time t20, and the command controller 12 interprets the command "READ". The command controller 12 changes the read enable signal RE to the active level, and the read/write controller 13 changes the read enable signal READE to the active level at time t21.

Then, the read enable signal READE of the high level disables the NOR gates NR1/NR2 and the NAND gates NAi/ NA2, and the NOR gates NR1/ NR2 and the NAND gates NAI/ NA2 supply the low level and the high level to the n-channel enhancement type field effect transistors N1/ N2 and the p-channel enhancement type field effect transistors P1/ P2. The n-channel enhancement type field effect transistors N1/ N2 and the p-channel enhancement type field effect transistors P1/ P2 turn off, and electrically isolate the read/ write data bus RWBUS-T/ RWBUS-N from the power sources Vdd/ GND.

The NAND gate NA3 is enabled with the read enable signal READE of the high level. The read pulse signal RPAL1 is in the low level, and the inverter IV3 supplies the high level signal to the NAND gate NA3. The NAND gate NA3 supplies the low level signal to the p-channel enhancement type field effect transistors P3/ P4, and causes the p-channel enhancement type field effect transistors P3/ P4 turn on. The p-channel enhancement type field effect transistors P3/ P4 charge the read/ write data bus RWBUS-T/N to the power voltage level.

The read enable signal READE of the high level enables the AND gates AD1/ AD2, and the inverter IV8 supplies the low level signal to the NOR gates NR3 of the second read data amplifiers 29/30 so as to enable the NOR gates NR3. The count signal CNT is in the low level, and the inverter IV10 supplies the high level signal to the AND gate AD2. For this reason, the AND gate AD2 chances the complementary control signal RPAL22 to the high level, and the other AND gate AD1 maintains the control signal RPAL21 in the low level. For this reason, the NOR gate NR3 of the second read data amplifier 29 supplies the high level signal to the transfer gates TG1/ TG2 and the inverter IV7, and causes the transfer gates TG1/ TG2 to connect the read/write data bus RWBUS-T/N to the data nodes RDATA-T/N. The read enable signal READE of the high level causes the p-channel enhancement type field effect transistors P5 to P7 to turn off, and the data nodes RDATA-T/N are isolated from each other. However, the NOR gate NR3 of the other second read data amplifier 30 supplies the low level signal to the transfer gates TG1/ TG2 and the inverter IV7, and the transfer gates TG1/ TG2 isolate the data nodes RDATA-T'/ N' from the read/write data bus RWBUS-T/N.

The read/write controller 13 changes the read pulse signal RPAL1 to the high level at time t22, and the read pulse signal RPAL1 of the high level causes the inverter IV3 and the NAND gate NA3 to supply the high level signal to the p-channel enhancement type field effect transistors P3/ P4. As a result, the read/write data bus RWBUS-T/N is isolated from the power supply line Vdd and the ground line GND.

The read pulse signal RPAL1 of the high level causes the n-channel enhancement type field effect transistors N4/ N6 to turn on, and activates the first read data amplifier 28. The differential amplifier 7a increases the magnitude of a potential difference on the read data bus RIO-T/N, and the potential difference causes the n-channel enhancement type field effect transistors N3/ N5 to selectively turn on. As a result, the read/write bus lines RWBUSTIN are selectively discharged through the n-channel enhancement type field effect transistors N5/N6 or N3/N4, and the potential difference is transferred from the read data bus RIO-T/N to the read/write data bus RWBUS-T/N. For this reason, the read/ write data bus lines RWBUS-T/N are separated from each other after time t22.

As described hereinbefore, the transfer gates TG1/ TG2 of the second read data amplifier 29 connects the read/write data bus RWBUS-T/N to the data nodes RDATA-T/N, and the potential difference is transferred from the read/write data bus RWBUS-T/N to the data nodes RDATA-T/N of the second read data amplifier 29.

The internal clock signal ICLK3 rises at time t23, and is supplied to the counter 26a and the read/write controller 13. The counter 26a changes the count signal CNT to the high level at time t24, and supplies the count signal CNT of the high level to the AND gates AD1/AD2 and the delay circuit 26b. The AND gate AD1 changes the control signal RPAL21 to the high level at time t25, and the other AND gate AD2 concurrently changes the complementary control signal RPAL22 to the low level.

The NOR gate NR3 of the second read data amplifier 29 supplies the low level signal to the transfer gates TG1/ TG2 and the inverter IV7, and the transfer gates TG1/ TG2 turn off so as to isolate the data nodes RDATA-T/N from the read/write data bus RWBUS-T/N. On the other hand, the NOR gate NR3 of the other second read data amplifier 30 turn on, and the data nodes RDATA-T'/ N' are connected to the read/write data bus RWBUS-T/N. The control signal RPAL21 of the high level activates the differential amplifier 8a of the second read data amplifier 29, and the differential amplifier 5a starts to increase the magnitude of the potential difference between the data nodes RDATA-T/N at time t26.

The read pulse signal RPAL1 causes the precharge circuit 24 to start the charging operation on the read/write data bus RWBUS-T/N, and the potential difference on the read/write data bus RWBUS-T/N is canceled at time t27.

The potential difference between the data nodes RDATA-TIN exceeds the threshold of the output inverters IV4/ IV5 between time t26 and time t27, and the potential difference is transferred from the data nodes RDATA-T/N to the read data bus RBUS-T1/ N1.

The delay circuit 26b changes the switching control signal SW to the high level, and the inverter IV11 changes the complementary switching control signal SWB to the low level at time t28. The switching control signal SW and the complementary signal SWB cause the transfer gates TG10/ TG11 of the selector 31 to turn on, and the potential difference is transferred from the read data bus RBUS-TI/ N1 through the read data bus OUT-T/N to the output data buffer 3.

The read/write controller 13 changes the read pulse signal RPAL1 to the high level at time t29, again. The precharge circuit 14 isolates the read/write data bus RWBUS-T/N from the power supply line Vdd and the ground line GND, and the first read data amplifier 28 is activated with the read pulse signal RPAL1. The first read data amplifier 28 transfers a potential difference representative of the next read-out data from the read data bus RIO-T/N to the read/ write data bus RWBUS-T/N, and the potential difference in turn is transferred from the read/write data bus RWBUS-T/N to the data nodes RDATA-T'/N' of the other second read data amplifier 30.

The internal clock signal ICLK3 rises at time t31, again. The counter 26a changes the count signal CNT to the low level at time t31, and the AND gates AD1/AD2 change the control signal RPAL21 and the complementary control signal RPAL22 to the low level and the high level at time t32, respectively. The complementary control signal RPAL22 of the high level causes the transfer gates TG1/ TG2 of the second read data amplifier 30 to turn off, and activates the differential amplifier 8a. On the other hand, the control signal RPAL21 of the low level causes the transfer gates TG1/ TG2 of the second read data amplifier 29 to turn on, and disables the differential amplifier 8a. As a result, the differential amplifier 8a of the second read data amplifier 30 starts to increase the magnitude of the potential difference between the data nodes RDATA-T'/ N' at time t33.

The read pulse signal RPAL1 is changed to the low level at time t32, and the precharge circuit 14 starts to charge the read/write data bus RWBUS-T/N. For this reason, the data nodes RDATA-T/N start to rise toward the power voltage level at time t33.

When the potential difference between the data nodes RDATA-T'/ N' exceeds the output inverters IV4/ IV5, the potential difference is transferred from the data nodes RDATA-T'/ N' to the read data bus RBUS-T2/ N2. The delay circuit 26b and the inverter IVIL change the switching control signal SW and the complementary switching control signal SWB to the low level and the high level at time t34. Then, the transfer gates TG1O/ TG11 turn off, and the other transfer gates TG12/ TG13 turn on. The potential difference is transferred from the read data bus RBUS-T2/ N2 through the read data bus OUT-T/N to the output data buffer 3 at time t35.

As will be appreciated from the foregoing description, the second data amplifier circuits 29/ 30 respectively maintains the potential differences representative of the pieces of read-out data over one cycle (see the waveform of the read data bus OUT-T/N), and the piece of read-out data is never destroyed by the next piece of read-out data. For this reason, the pipeline data propagation system 22 according to the present invention does not need the read data latch circuit 9.

Moreover, the precharging operation is overlapped with the differential amplification of the second read data amplifier, and the pipeline read-out operation is accelerated.

Second Embodiment

Figure 7:
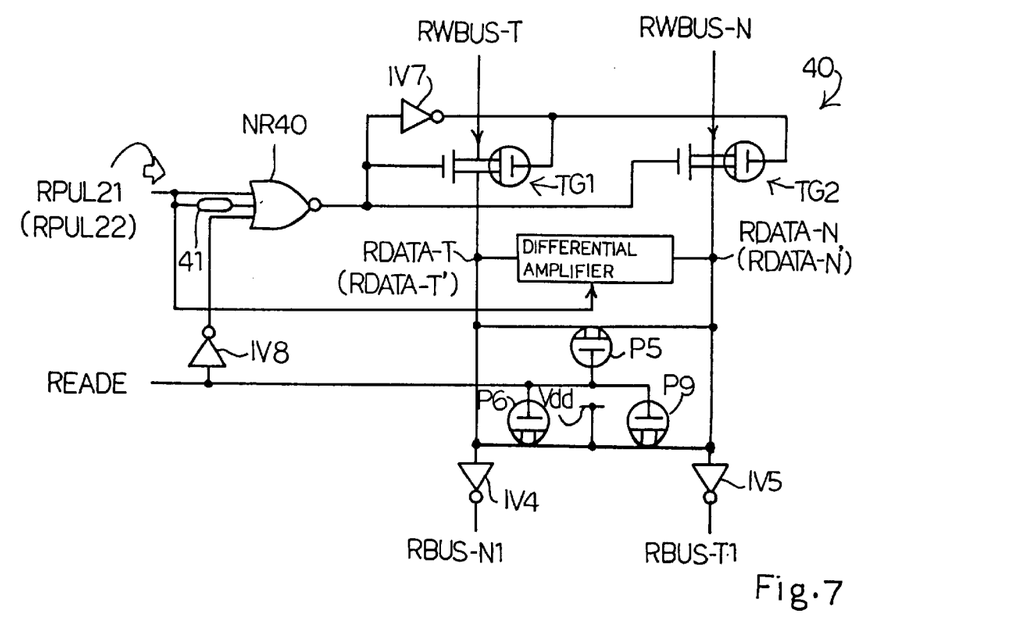
FIG. 7 is a circuit diagram showing the configuration of a second read data amplifier incorporated in another semiconductor synchronous pipeline memory device according to the present invention.

FIG. 7 illustrates a second read data amplifier 40 incorporated in another semiconductor synchronous pipeline dynamic random access memory device embodying the present invention. The second read data amplifier 40 is replaced with each of the second read data amplifiers 29/30, and the other circuits are similar to those of the first embodiment. For this reason, description is focused on the second read data amplifier 40.

The NOR gate NR3 is replaced with a delay circuit 41 and a NOR gate NR40. The control signal RPUL21/ RPUL22 is directly supplied to one of the input nodes of the NOR gate NR40 and through the delay circuit 41 to another input node of the NOR gate NR40. The delay circuit 41 causes the transfer gates TG1/ TG2 to turn on after the off-timing of the transfer gates TG1/ TG2 of the other second read data amplifier. As a result, the potential difference is never transferred between the two second read data amplifiers 40, and the data read-out data is never destroyed. Although particular embodiments of the present invention have been shown and described, it will be obvious to those skilled in the art that various changes and modifications may be made without departing from the spirit and scope of the present invention.

For example, static random access memory cells may form the memory cell array 20. Any kind of memory cell is available for the memory cell array 20.

More than two second read data amplifier may be incorporated in a semiconductor synchronous pipeline dynamic random access memory device. In this instance, the more than two second read data amplifiers are sequentially activated in the pipeline read-out operation.

What is claimed is:

1. A semiconductor synchronous pipeline memory device comprising:
    a data storage for storing pieces of data; and
    a data propagation system for propagating pieces of data between a data port and said data storage, and including
        a first data amplifier receiving data signals respectively representative of said pieces of data from said data storage at intervals and increasing the magnitude of each of said data signals,
        a plurality of second data amplifiers arranged in parallel with respect to said first data amplifier, receiving said data signals from said first data amplifier at intervals and increasing the magnitude of each of said data signals,
        a first signal propagation path connected between said first data amplifier and said plurality of second data amplifiers for propagating said data signals,
        a data canceling circuit connected to said first signal propagation path so as to cancel each of said data signals after said each of said data signals reaches one of said plurality of second data amplifiers,
        a data output circuit receiving said data signals from said plurality of second data amplifiers for successively outputting said data signals,
        a selector connected between said plurality of second data amplifiers and said data output circuit,
        a distributor connected to said plurality of second data amplifiers and distributing said data signals to said plurality of second data amplifiers in synchronism with a clock signal, and
        a timing controller connected to said first data amplifier, said plurality of second data amplifiers, said data canceling circuit and said distributor for transferring said data signals through said first data amplifier to said data output circuit.

2. The semiconductor synchronous pipeline memory device as set forth in claim 1, in which said timing controller produces an internal clock signal supplied to said distributor and a first control signal supplied to said data canceling circuit and said first data amplifier, said distributor produces a plurality of second control signals in response to said internal clock signal, and each of said plurality of second data amplifiers includes
    an amplifier circuit activated with one of said second control signals for increasing said magnitude of said each of said data signals,
    a transfer circuit connected between said first signal propagation path and said amplifier, responsive to said one of said plurality of second control signals so as to be changed between on-state and off-state and isolating said amplifier from said first signal propagation path during the increase of said magnitude.

3. The semiconductor synchronous pipeline memory device as set forth in claim 2, in which said distributor further produces a third control signal from said plurality of second control signals, and said third control signal is supplied to said selector so as to selectively connects the amplifiers of said plurality of second data amplifiers to a second signal propagation path connected between said selector and said data output circuit.

4. The semiconductor synchronous pipeline memory device as set forth in claim 2, in which said each of said plurality of second data amplifiers further includes a delay circuit responsive to said one of said plurality of second control signals so as to introduce time delay between arrival of said one of said plurality of second control signals and the change of said transfer circuit to said on-state.

5. The semiconductor synchronous pipeline memory device as set forth in claim 1, in which said timing controller and said distributor defines a first time period when said data canceling circuit cancels one of said data signals and, thereafter, said first data amplifier transfers another of said data signals next to said one of said data signals through said first signal propagation path to one of said plurality of second data amplifiers, a second time period partially overlapped with said first time period and the next first time period, said one of said plurality of second data amplifiers being isolated from said first signal propagation path and increasing the magnitude of said another of said data signals in said second time period, and a third time period partially overlapped with said next first time period, said selector transferring said another of said data signals from said one of said plurality of second data amplifiers to said data output circuit in said third time period.

* * * * *